(12) United States Patent
Nakamura et al.

(10) Patent No.: US 6,433,632 B1
(45) Date of Patent: Aug. 13, 2002

(54) CORRELATED DOUBLE SAMPLING CIRCUIT WITH OP AMP

(75) Inventors: Katsufumi Nakamura, Boston, MA (US); Steven Decker, Derry, NH (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 09/579,748

(22) Filed: May 26, 2000

Related U.S. Application Data

(60) Provisional application No. 60/138,960, filed on Jun. 11, 1999.

(51) Int. Cl.[7] .................................................. H03F 1/14
(52) U.S. Cl. .......................................... 330/9; 327/124
(58) Field of Search ............................... 330/9; 327/124, 327/307

(56) References Cited

U.S. PATENT DOCUMENTS

| | | | | | |
|---|---|---|---|---|---|
| 4,387,345 A | * | 6/1983 | Kelley | ............................ | 330/9 |
| 4,403,195 A | * | 9/1983 | Wurzburg | ....................... | 330/9 |
| 4,429,282 A | * | 1/1984 | Saari | .............................. | 330/9 |
| 4,446,438 A | * | 5/1984 | Chang et al. | .................. | 330/9 |
| 5,084,639 A | * | 1/1992 | Ribner | ........................... | 330/9 |
| 5,872,470 A | * | 2/1999 | Mallinson et al. | ............ | 327/94 |
| 5,912,584 A | * | 6/1999 | Iizuka | ........................... | 330/85 |
| 6,018,364 A | | 1/2000 | Mangelsdorf | | |
| 6,049,247 A | * | 4/2000 | Krymski | ........................ | 330/9 |

* cited by examiner

*Primary Examiner*—Robert Pascal
*Assistant Examiner*—Khanh Van Nguyen
(74) *Attorney, Agent, or Firm*—Wolf, Greenfield & Sacks, P.C.

(57) ABSTRACT

A switched capacitor correlated double sampling circuit includes an op amp, an input sampling capacitor, and a feedback capacitor. The input capacitor samples the input signal during a first time phase and the feedback capacitor receives the signal charge from the input capacitor. No sampling switch is located between the input capacitor and the input terminal.

13 Claims, 8 Drawing Sheets

CORRELATED DOUBLE SAMPLING CIRCUIT WITH OP AMP

RELATED APPLICATION

This applications claims the benefit, under 35 U.S.C. §119(e), of the filing date of provisional application serial No. 60/138,960, filed Jun. 11, 1999. This application is related to application Ser. No. 09/579,646 filed May 26, 2000.

FIELD OF THE INVENTION

The present invention is related to correlated double sampling circuits.

BACKGROUND

A charge-coupled device (CCD) output waveform is a sequence of pixels, where each pixel is represented as the difference between a reset level and a data level. This signal waveform is initially processed before being passed on to the automatic gain control (AGC) circuit:

The data level is subtracted from the reset level on a pixel-by-pixel basis to remove the reset noise component common to both signals. This operation is called correlated double-sampling (CDS).

One prior art CDS is shown in block diagram form in FIG. 1(a) with an associated control signal timing diagram shown in FIG. 1(b). FIG. 1(a) shows a pipelined CDS circuit. The circuit has two non-overlapping time phases of operation: In the Q1 phase of the pipelined CDS circuit, the reset level is sampled by sample-and-hold (S/H) #1. A schematic diagram of a typical S/H is shown in FIG. 2. In the Q2 phase, the data level is sampled by S/H #2. Simultaneously, S/H #3 samples the output of S/H #1.

Drawbacks of the pipelined CDS technique are: (1) There are three sampling operations, which increases the noise over techniques requiring only two sampling operations; and (2) Any gain or offset mismatch between the reset path (S/H #1 and S/H #3) and the data path (S/H #2) limits the ability of the CDS to remove reset noise.

Another prior art CDS is shown in FIG. 3(a). The associated timing diagram is shown in FIG. 3(b). FIG. 3(a) shows a dual CDS circuit.

S/H #1 and S/H #2 form a single CDS circuit, and S/H #3 and S/H #4 form a second single CDS circuit. Each single CDS processes alternate pixels. Thus, two CDS circuits are required to process all pixels.

The dual CDS has four phases of operation: In the Q1A phase, the reset level of the first pixel is sampled by S/H #1. The output switch is set to B. In the Q1B phase, the data level of the first pixel is sampled by S/H #2. The output switch is set to B. In the Q2A phase, the reset level of the second pixel is sampled by S/H #3. The output switch is set to A. In the Q2B phase, the data level of the second pixel is sampled by S/H #4. The output switch is set to A.

Compared to the pipeline CDS of FIG. 1(a), the dual CDS has lower noise because only two sampling operations are performed for each pixel. Also, the AGC has a fall period to sample each pixel.

Drawbacks of the dual CDS scheme include: (1) Two CDS circuits are required because the previous pixel value must be held while the reset level of the next pixel is sampled; and (2) Even and odd pixels use different CDS circuits, causing gain and offset errors which must be removed.

SUMMARY

Applicants herein have discovered that in both prior art techniques, it is difficult to apply a variable gain within the CDS.

The present invention is directed to a correlated double sampling circuit which is able to remove correlated noise and sample each pixel with no internal offset.

One embodiment of the invention is directed to an amplifier circuit including an amplifier having an input and an output. The circuit also includes an input terminal that receives an input signal. An input capacitor is coupled between the input of the amplifier and the input terminal, onto which input capacitor charge from the input signal is sampled during a first of first and second time phases. A feedback capacitor, coupled between the input and the output of the amplifier, receives charge from the input capacitor during the second time phase. No sampling switch is located between the input capacitor and the input terminal.

In an embodiment, the input capacitor includes a variable capacitor.

In an embodiment, the feedback capacitor includes a variable capacitor.

BRIEF DESCRIPTION OF THE DRAWINGS

For a better understanding of the present invention, reference is made to the accompanying drawings, which are incorporated herein by reference and in which.

DETAILED DESCRIPTION

One embodiment of the invention is directed to a correlated double sampling circuit, used in image applications (e.g., image sensors) for pixel sampling. It should be appreciated that the invention is not so limited to this particular embodiment. For example, the invention need not be limited to image applications in which pixels are sampled.

One embodiment described herein is directed to a switched-capacitor amplifier circuit for sampling input voltages. Again, the invention need not be limited to a switched-capacitor circuit.

Figure 1A:
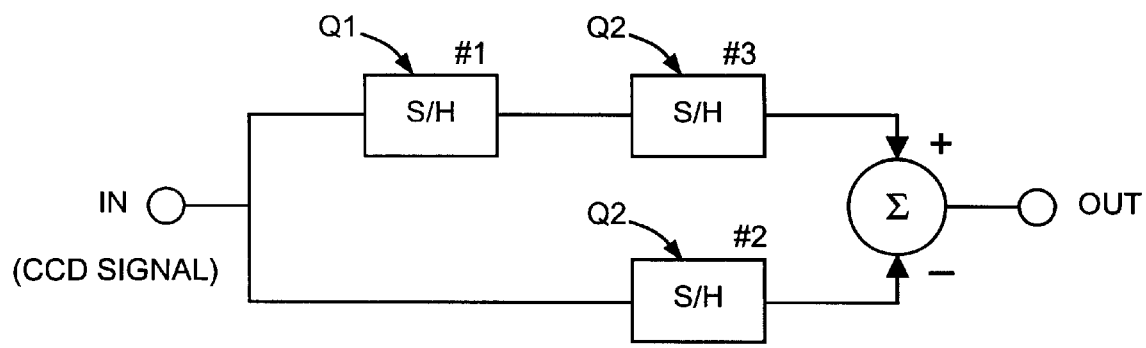
FIG. 1(a) is a block diagram of a pipeline CDS circuit according to the prior art.
Figure 1B:
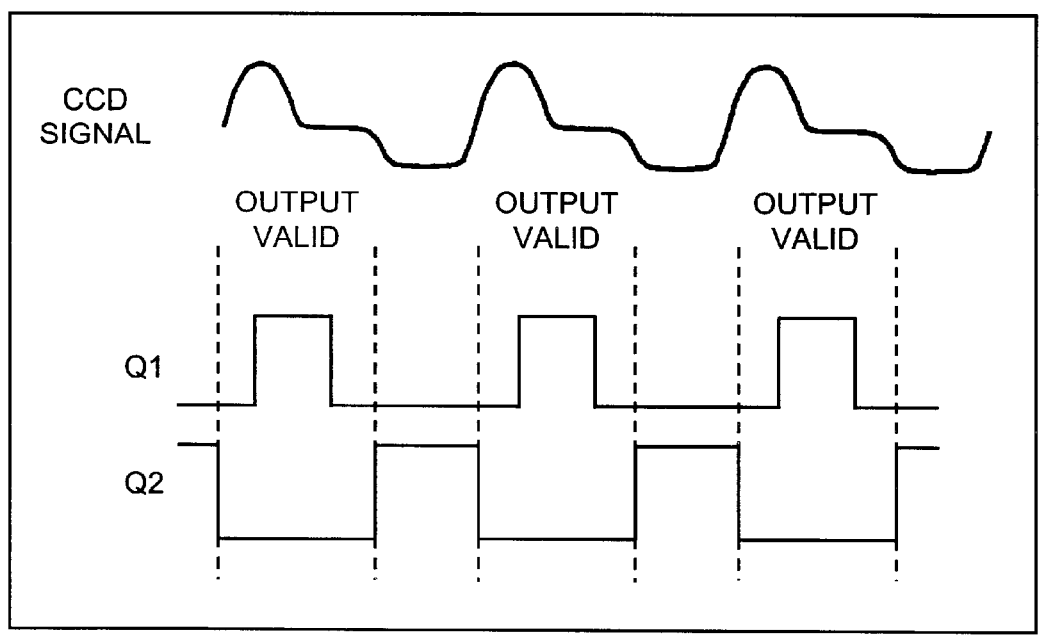
FIG. 1(b) is a signal timing diagram for a pipeline CDS circuit according to the prior art.
Figure 2:
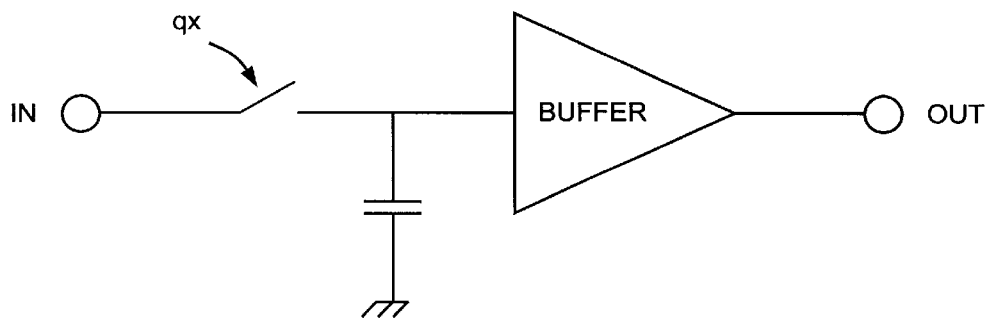
FIG. 2 is a block diagram of a sample and hold circuit according to the prior art.
Figure 3A:
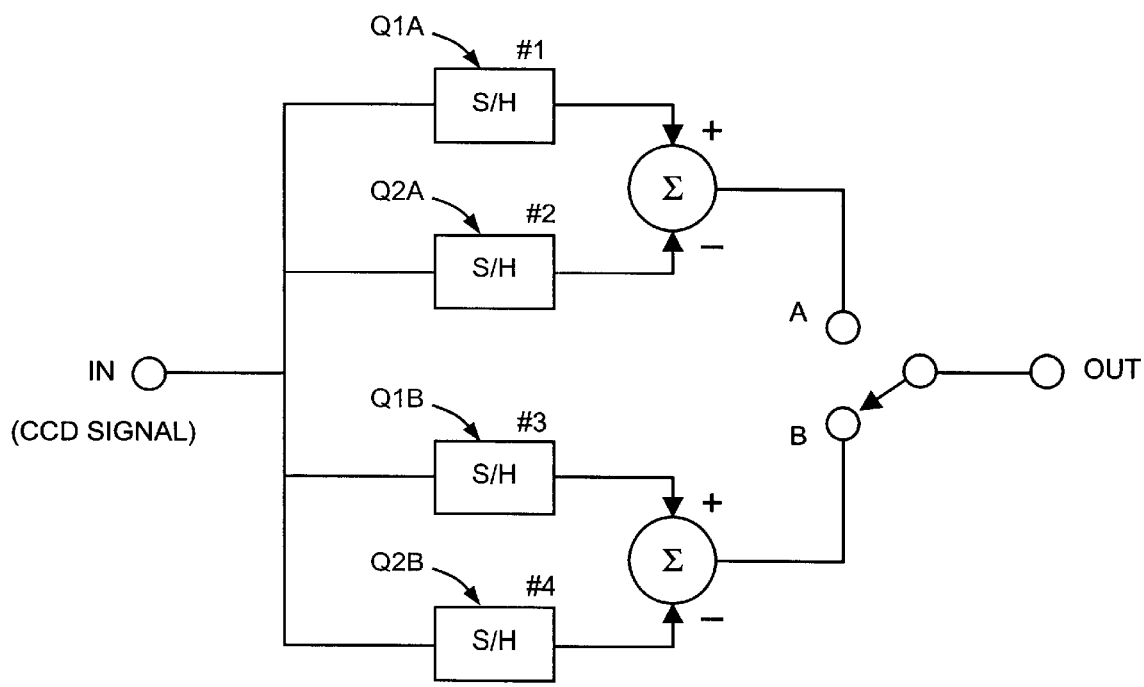
FIG. 3(a) is a block diagram of a dual CDS circuit according to the prior art.
Figure 3B:
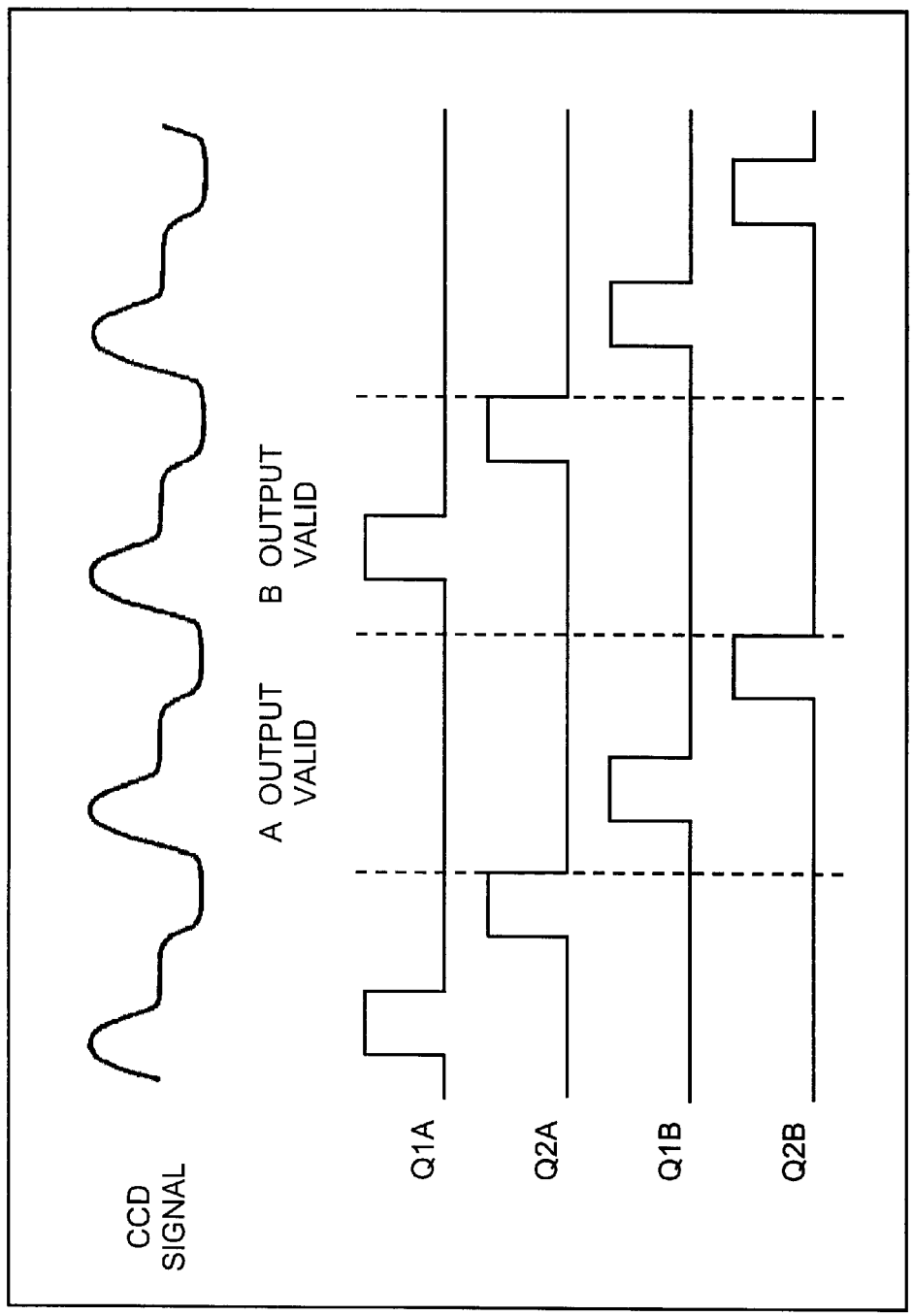
FIG. 3(b) is a timing diagram for a dual CDS circuit according to the prior art.
Figure 4A:
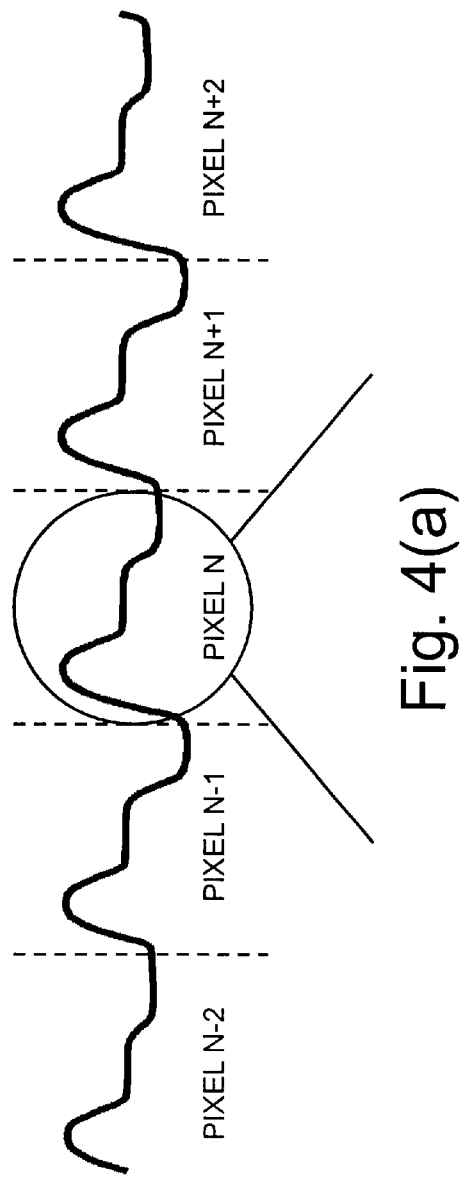
FIG. 4(a) is a diagram of a CCD waveform.
Figure 4B:
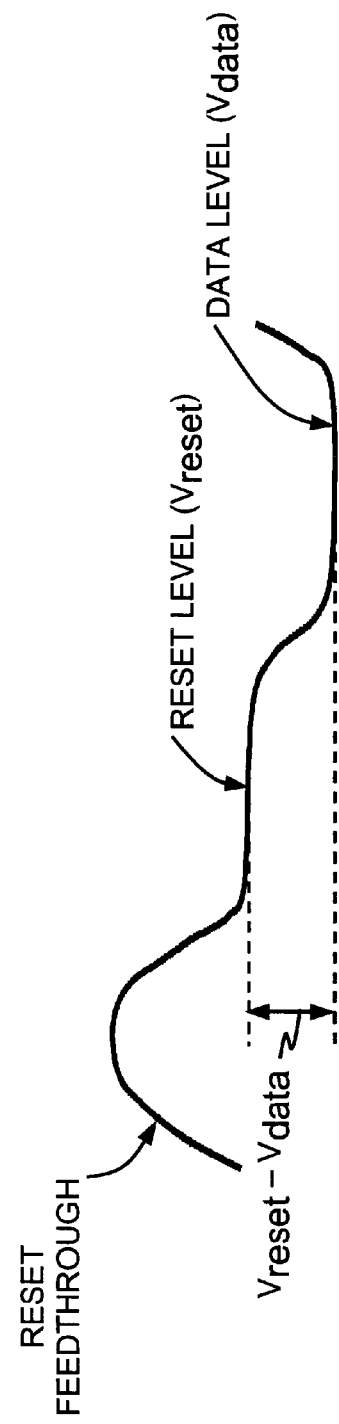
FIG. 4(b) is a diagram of a single pixel waveform.

FIG. 4(a) shows a stream of pixels output from a CCD to a CDS. One of the errors inherent in a CCD signal is the error which exists from one pixel to another. This error is called reset noise. As shown in FIG. 4(b), every pixel starts with a reset level (Vreset) then is given a data level (Vdata). However, every reset operation has associated with it a unique random noise which causes the Vreset to be different for every pixel. The CDS removes this pixel noise by sampling Vreset then Vdata and charting the difference, Vreset−Vdata. A switched capacitor circuit is used to remove the pixel noise.

Figure 5A:
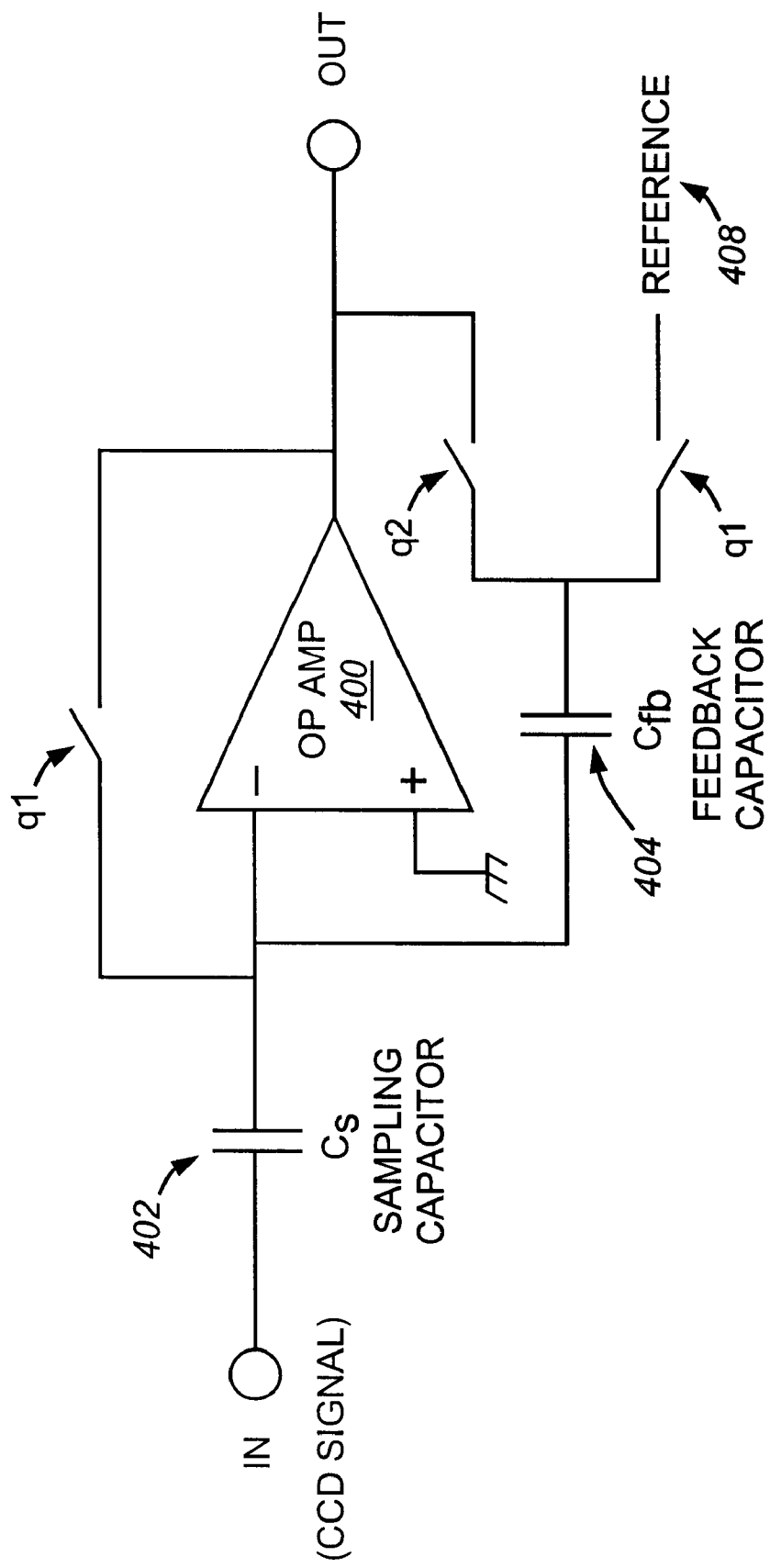
FIG. 5(a) is a block diagram of a CDS/pixel gain amplifier (PxGA) circuit according to the invention.

FIG. 5(a) shows simplified diagrams for a switched-capacitor circuit, according to one embodiment, which performs correlated double-sampling and pixel gain. This circuit employs two time phases (q1 and q2) of operation.

Figure 5B:
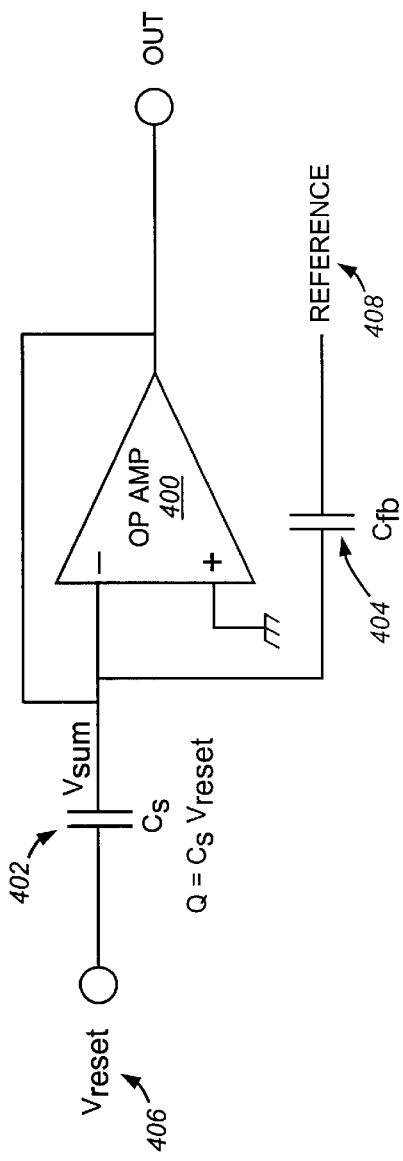
FIG. 5(b) is a block diagram of a CDS/PxGA circuit in the first time phase.

In the reset (q1) phase, shown in FIG. 5(b), the main amplifier 400 is placed in unity-gain feedback to provide a virtual ground at the summing node. The sampling capacitor 402 samples the reset level Vreset 406 and the feedback capacitor 404 samples a reference 408. The reference 408 may be ground.

Figure 5C:
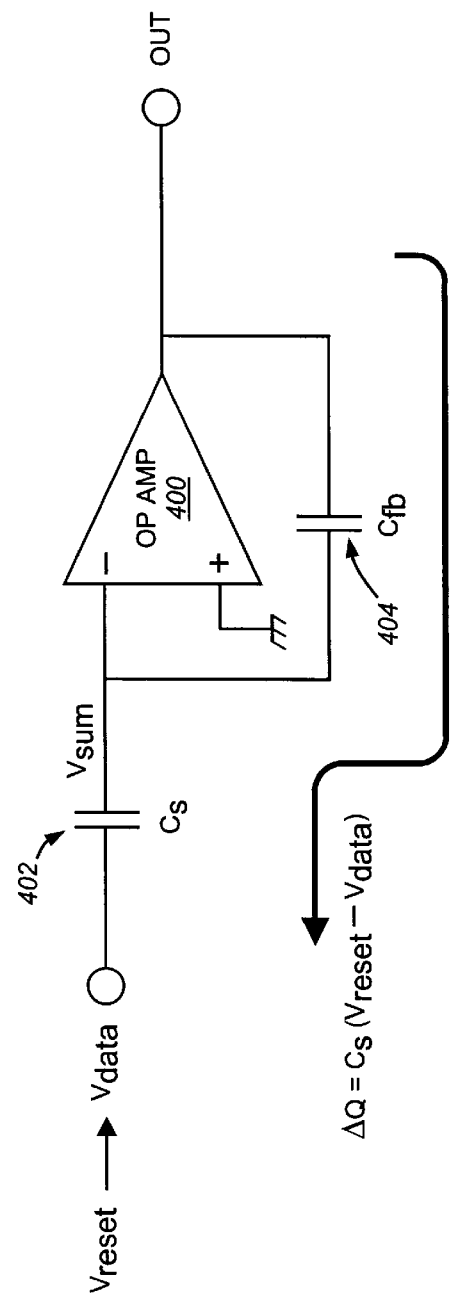
FIG. 5(c) is a block diagram of a CDS/PxGA circuit in the second time phase.
Figure 5D:
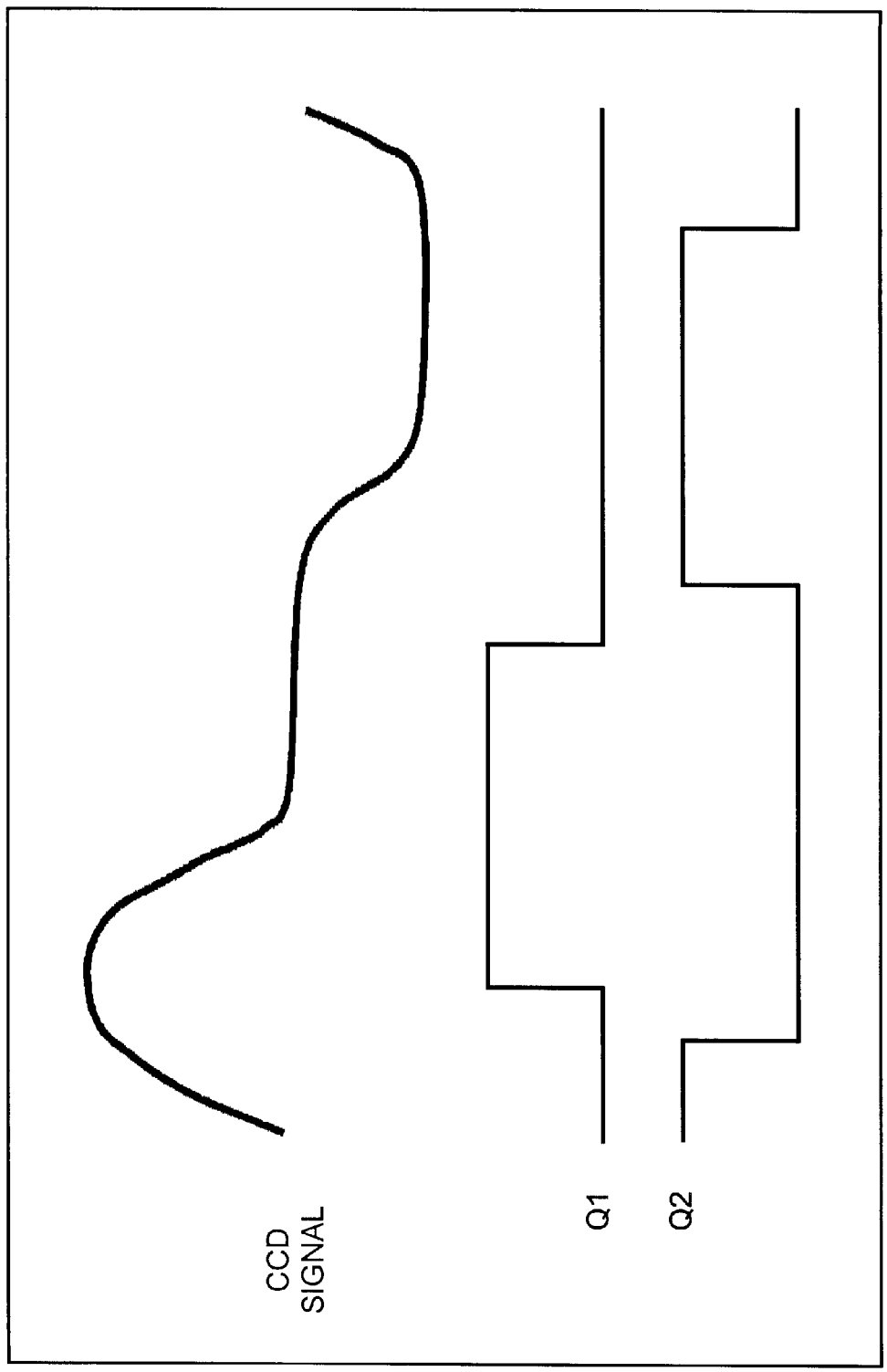
FIG. 5(d) is a timming diagram for a CDC/PxGA circuit.

In the data (q2) phase, shown in FIG. 5(c), the feedback capacitor 404 is placed in feedback around the op amp 400 and the voltage applied to the sampling capacitor 402 changes by Vreset−Vdata. This forces a charge $\Delta Q=C_s$ (Vreset−Vdata) to shift from Cs 402 to Cfb 404, resulting in an output signal of (Cs/Cfb)(Vreset−Vdata).

For example, assume that Cs=20 pF, Cfb=10 pF, Vreset=2 V, and Vdata=1.5 V. Since the voltage on Cs 402 changes from 2 V to 1.5 V, a charge of 20 pC (2−1.5)=10 pC shifts onto Cfb 404, resulting in an output voltage of 10 pC/10 pF=1 V.

By changing the capacitance values on the sampling capacitor 402 and/or the feedback capacitor 404, Cs and/or Cfb from pixel-to-pixel, the gain can be changed at the pixel rate. The input sampling capacitor 402 and/or the feedback capacitor 404 may be variable for this purpose.

Figure 6:
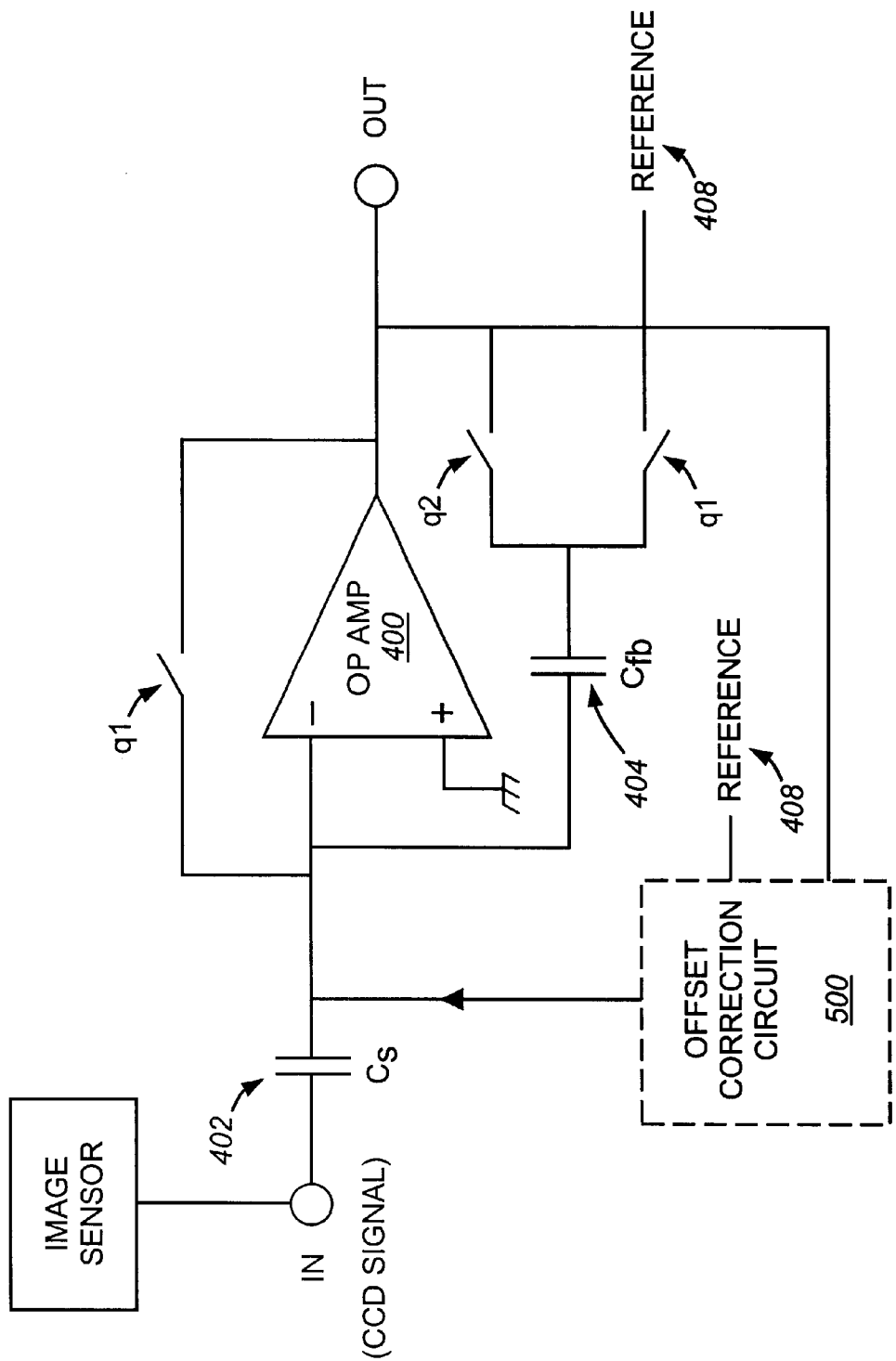
FIG. 6 is a block diagram for a CDC/PxGA circuit with offset correction.

FIG. 6 shows a scheme for implementing offset correction in this CDS. Offset correction prevents the AGC from saturating when large gains are applied to small-amplitude input signals. The offset correction circuit 500 samples the CDS output and applies a correction signal to the summing node. The magnitude and sign of the correction signal is the same for all pixels, and is chosen so that during a "black pixel" interval where the input signal corresponds to black pixels, the output is zero. The preferred implementation of this offset correction circuit 500 is used with a fixed-value sampling capacitor Cs 402, as indicated in FIG. 6.

Advantages of the switched capacitor with op amp CDS include: (a) reset noise between the pixels is eliminated; (b) a simple method can be used for offset correction, independent of gain; and (c) all pixels are processed through the same signal path, avoiding pixel-to-pixel offset.

Having thus described at least one illustrative embodiment of the invention, various alterations, modifications and improvements will readily occur to those skilled in the art. Such alterations, modifications and improvements are intended to be within the spirit and scope of the invention. For example, the invention need not be limited to image applications in which pixels are sampled, nor need it be limited to a switched capacitor circuit. Accordingly, the foregoing description is by way of example only and is not intended as limiting. The invention is limited only as defined in the following claims and the equivalents thereto.

What is claimed is:

1. An amplifier circuit comprising:
   an amplifier having an input and an output;
   an input terminal that receives an input signal;
   an input capacitor, coupled between the input of the amplifier and the input terminal, onto which input capacitor charge from the input signal is sampled during a first of first and second time phases; and
   a feedback capacitor, coupled between the input and the output of the amplifier, that receives charge from the input capacitor during the second time phase;
   wherein no sampling switch is located between the input capacitor and the input terminal;
   wherein the feedback capacitor is switchably connected to a reference voltage during the first time phase, and to the output of the amplifier during the second time phase; and
   wherein the amplifier input is coupled to an image sensor and receives a pixel sample voltage.

2. The amplifier circuit as claimed in claim 1, wherein the input capacitor comprises a variable capacitor.

3. The amplifier circuit as claimed in claim 1, wherein the feedback capacitor comprises a variable capacitor.

4. The amplifier circuit as claimed in claim 1, further comprising an offset correction circuit coupled between the amplifier input and the amplifier output.

5. The amplifier circuit as claimed in claim 1, wherein the amplifier input is connected to a charge coupled device (CCD).

6. The amplifier circuit as claimed in claim 1, wherein the amplifier comprises an operational amplifier.

7. The amplifier circuit as claimed in claim 1, wherein the reference voltage is a ground voltage.

8. A method for reducing noise in a correlated double-sampling circuit, comprising:
   during a first time phase:
      sampling a reset level voltage at an input of a sampling capacitor coupled to an input of an amplifier;
      switching a first switch to couple an output of the amplifier directly to the input of the amplifier; and
      switching a second switch to couple a feedback capacitor between a reference voltage and the input of the amplifier; and
   during a second time phase:
      sampling a data voltage at the input of the sampling capacitor;
      switching the first switch so that no direct coupling exists between the output of the amplifier and the input of the amplifier; and
      switching the second switch to couple the feedback capacitor between the output of the amplifier and the input of the amplifier;
      wherein the act of switching during the second time phase comprises shifting a charge proportional to the difference between the reset level voltage and the data voltage from the sampling capacitor to the feedback capacitor.

9. A method for reducing noise in a correlated double-sampling circuit, comprising:
   during a first time phase:
      sampling a reset level voltage at an input of a sampling capacitor coupled to an input of an amplifier;
      switching a first switch to couple an output of the amplifier directly to the input of the amplifier; and
      switching a second switch to couple a feedback capacitor between a reference voltage and the input of the amplifier; and during a second time phase:
sampling a data voltage at the input of the sampling capacitor;
  switching the first switch so that no direct coupling exists between the output of the amplifier and the input of the amplifier; and
  switching the second switch to couple the feedback capacitor between the output of the amplifier and the input of the amplifier;
further comprising applying a correction signal to a summing node of the amplifier using an offset correction circuit.

10. The method of claim 8 or 9, further comprising, during the first time phase, placing the amplifier in unity-gain feedback.

11. The method of claim 8 or 9, further comprising, during the first time phase, providing a virtual ground at a summing node of the amplifier.

12. The method of claim 8 or 9, further comprising changing the capacitance of the sampling capacitor.

13. The method of claim 8 or 9, further comprising changing the capacitance of the feedback capacitor.

* * * * *